US012610811B2

(12) United States Patent
Xiao et al.

(10) Patent No.: US 12,610,811 B2
(45) Date of Patent: Apr. 21, 2026

(54) SEMICONDUCTOR STRUCTURE, TEST STRUCTURE, MANUFACTURING METHOD AND TEST METHOD

(71) Applicant: CHANGXIN MEMORY TECHNOLOGIES, INC., Hefei City (CN)

(72) Inventors: Deyuan Xiao, Hefei (CN); Guangsu Shao, Hefei (CN); Yi Jiang, Hefei (CN); Xingsong Su, Hefei (CN); Yunsong Qiu, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 576 days.

(21) Appl. No.: 18/153,396

(22) Filed: Jan. 12, 2023

(65) Prior Publication Data

US 2023/0378064 A1     Nov. 23, 2023

Related U.S. Application Data

(63) Continuation of application No. PCT/CN2022/102874, filed on Jun. 30, 2022.

(30) Foreign Application Priority Data

May 23, 2022     (CN) .......................... 202210563778.8

(51) Int. Cl.
  *H01L 23/528*     (2006.01)
  *H01L 21/3105*     (2006.01)
        (Continued)

(52) U.S. Cl.
  CPC .... *H01L 23/5283* (2013.01); *H01L 21/31055* (2013.01); *H01L 21/31122* (2013.01);
        (Continued)

(58) Field of Classification Search
  None
  See application file for complete search history.

(56) References Cited

U.S. PATENT DOCUMENTS 7,312,117 B2     12/2007  Lee
8,541,826 B2      9/2013  Pan
        (Continued)

FOREIGN PATENT DOCUMENTS

CN     102522407 A     6/2012
CN     105762114 A     7/2016
        (Continued)

OTHER PUBLICATIONS

CN102522407A, Pan et al., Memory Array Structure with Vertical Transistor and Forming Method Thereof, 2012 (Year: 2012).*

*Primary Examiner* — Alexander G Ghyka
(74) *Attorney, Agent, or Firm* — SYNCODA LLC; Feng Ma

(57)     ABSTRACT

Provided is a semiconductor structure, a test structure, a manufacturing method and a test method. The semiconductor structure includes a substrate, which includes multiple pillars spaced along a first direction by first trenches; second trenches formed at opposite sides along a second direction of each of the pillars; target conductive structures extending along the second direction in the substrate directly below adjacent second trenches; and a first dielectric layer, a conductive layer and a second dielectric layer sequentially stacked in the first trenches and the second trenches. A depth of the first trenches is greater than that of the second trenches. The first direction intersects the second direction.

10 Claims, 11 Drawing Sheets

(51) Int. Cl.

| | |
|---|---|
| *H01L 21/311* | (2006.01) |
| *H01L 21/3213* | (2006.01) |
| *H01L 21/324* | (2006.01) |
| *H01L 21/56* | (2006.01) |
| *H01L 21/66* | (2006.01) |
| *H01L 21/768* | (2006.01) |
| *H01L 23/31* | (2006.01) |
| *H01L 23/532* | (2006.01) |
| *H10D 30/01* | (2025.01) |
| *H10D 30/43* | (2025.01) |
| *H10D 30/67* | (2025.01) |
| *H10D 62/10* | (2025.01) |

(52) U.S. Cl.

CPC .. *H01L 21/32134* (2013.01); *H01L 21/32136* (2013.01); *H01L 21/324* (2013.01); *H01L 21/56* (2013.01); *H01L 21/76816* (2013.01); *H01L 21/76819* (2013.01); *H01L 21/76831* (2013.01); *H01L 21/76837* (2013.01); *H01L 21/76883* (2013.01); *H01L 21/76885* (2013.01); *H01L 22/14* (2013.01); *H01L 22/32* (2013.01); *H01L 23/3178* (2013.01); *H01L 23/53209* (2013.01); *H10D 30/014* (2025.01); *H10D 30/43* (2025.01); *H10D 30/6735* (2025.01); *H10D 62/122* (2025.01)

(56) References Cited

U.S. PATENT DOCUMENTS

| | | | |
|---|---|---|---|
| 8,742,493 | B2 | 6/2014 | Kim |
| 10,020,308 | B2 | 7/2018 | Luan |
| 10,679,721 | B2 | 6/2020 | Kim |
| 10,998,079 | B2 | 5/2021 | Kim |
| 2006/0022256 | A1 | 2/2006 | Lee |
| 2008/0061352 | A1 | 3/2008 | Lee |
| 2012/0119286 | A1 | 5/2012 | Kim |
| 2013/0161730 | A1 | 6/2013 | Pan |
| 2016/0379984 | A1 | 12/2016 | Luan et al. |
| 2017/0352665 | A1 | 12/2017 | Luan et al. |
| 2018/0323198 | A1 | 11/2018 | Luan et al. |
| 2019/0057756 | A1 | 2/2019 | Kim et al. |
| 2020/0265913 | A1 | 8/2020 | Kim et al. |
| 2023/0171938 | A1* | 6/2023 | Xiao .................... H10B 12/488 |
| | | | 439/270 |

FOREIGN PATENT DOCUMENTS

| | | |
|---|---|---|
| CN | 107564861 A | 1/2018 |
| CN | 107946202 B | 12/2018 |
| CN | 110088899 A | 8/2019 |
| CN | 113644032 A | 11/2021 |
| CN | 114141713 A | 3/2022 |
| CN | 114256158 A | 3/2022 |

* cited by examiner

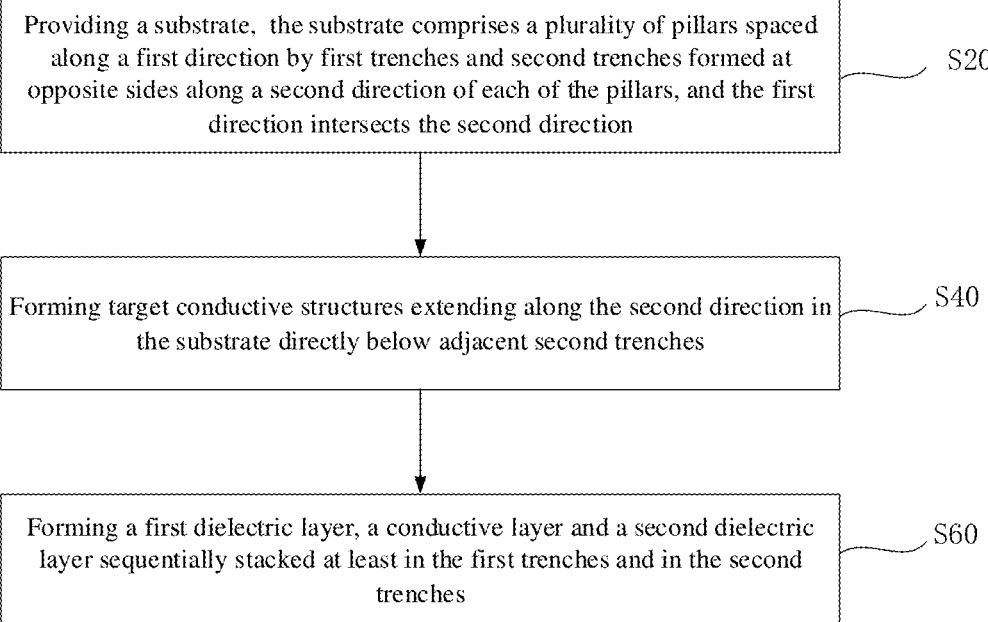

| Providing a substrate, the substrate comprises a plurality of pillars spaced along a first direction by first trenches and second trenches formed at opposite sides along a second direction of each of the pillars, and the first direction intersects the second direction | S20 |

| Forming target conductive structures extending along the second direction in the substrate directly below adjacent second trenches | S40 |

| Forming a first dielectric layer, a conductive layer and a second dielectric layer sequentially stacked at least in the first trenches and in the second trenches | S60 |

FIG. 1

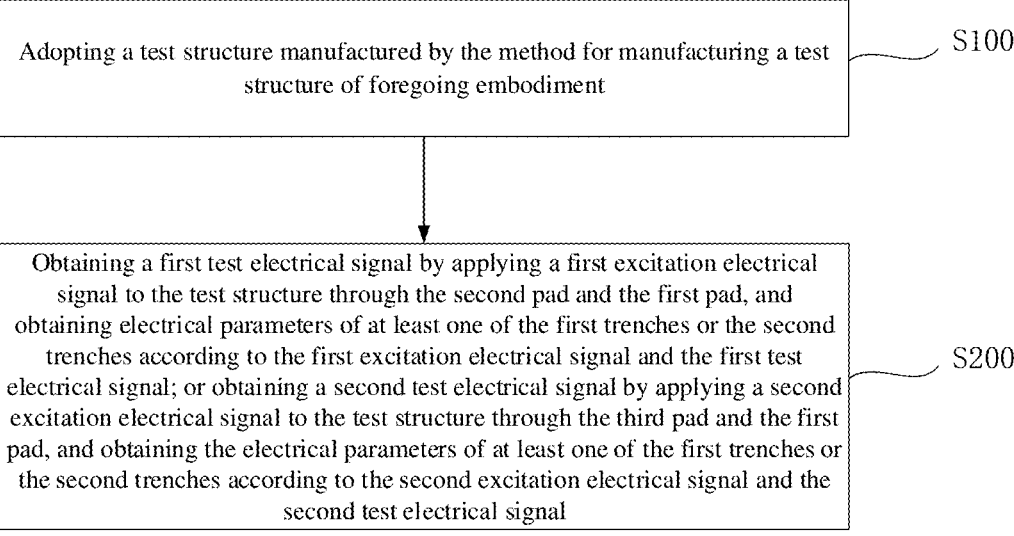

Adopting a test structure manufactured by the method for manufacturing a test structure of foregoing embodiment          S100

Obtaining a first test electrical signal by applying a first excitation electrical signal to the test structure through the second pad and the first pad, and obtaining electrical parameters of at least one of the first trenches or the second trenches according to the first excitation electrical signal and the first test electrical signal; or obtaining a second test electrical signal by applying a second excitation electrical signal to the test structure through the third pad and the first pad, and obtaining the electrical parameters of at least one of the first trenches or the second trenches according to the second excitation electrical signal and the second test electrical signal          S200

FIG. 11

SEMICONDUCTOR STRUCTURE, TEST STRUCTURE, MANUFACTURING METHOD AND TEST METHOD

CROSS-REFERENCE TO RELATED APPLICATIONS

This application is a continuous application of International Application No. PCT/CN2022/102874, filed on Jun. 30, 2022, which claims priority to Chinese Patent Application No. 202210563778.8, filed on May 23, 2022. The disclosures of International Application No. PCT/CN2022/102874 and Chinese Patent Application No. 202210563778.8 are hereby incorporated by reference in their entireties.

BACKGROUND

With the continuous improvement of integration and performance of memories, the adoption of vertical gate all around transistors (VGAA transistors for short) can effectively reduce the dimension of memories.

However, in a VGAA transistor, the space of a word line structure is narrow since the word lines are isolated from each other, and the word line structure is easily damaged when measuring electrical properties.

SUMMARY

The disclosure relates to a technical field of integrated circuit design and manufacture, in particular to a semiconductor structure, a test structure, a manufacturing method and a test method.

According to embodiments of the disclosure, a semiconductor structure, a test structure, a preparation method and a test method are provided.

According to some embodiments, the first aspect of the disclosure provides a semiconductor structure. The semiconductor structure includes a substrate, which includes a plurality of pillars spaced along a first direction by first trenches; second trenches formed at opposite sides along a second direction of each of the pillars; target conductive structures extending along the second direction and formed in the substrate directly below adjacent second trenches; and a first dielectric layer, a conductive layer and a second dielectric layer sequentially stacked in the first trenches and the second trenches. A depth of the first trenches is greater than a depth of the second trenches. The first direction intersects the second direction.

According to some embodiments, the second aspect of the disclosure provides a test structure, including the semiconductor structure in any of the foregoing embodiments, a first pad, a second pad and/or a third pad. The first pad is electrically connected with one of the pillars. The second pad is electrically connected with the conductive layer. The third pad is electrically connected with one of the conductive regions.

According to some embodiments, the third aspect of the disclosure provides a method for manufacturing a semiconductor structure. The method includes the following operations. A substrate is provided, in which the substrate includes a plurality of pillars spaced along a first direction by first trenches and second trenches formed at opposite sides along a second direction of each of the pillars, and the first direction intersects the second direction. Target conductive structures extending along the second direction are formed in the substrate directly below adjacent second trenches. A first dielectric layer, a conductive layer and a second dielectric layer are sequentially stacked at least in the first trenches and the second trenches.

According to some embodiments, the fourth aspect of the disclosure provides a method for manufacturing a test structure, including the following operations. A semiconductor structure in any of the foregoing embodiments is provided. A first pad electrically connected with one of the pillars is formed. A second pad and/or a third pad is formed. The second pad is electrically connected with the conductive layer, and the third pad is electrically connected with one of the conductive regions.

According to some embodiments, the fifth aspect of the disclosure provides a test method, including the following operations. A test structure manufactured by the method for manufacturing the test structure in the foregoing embodiments is adopted. A first test electrical signal is obtained by applying a first excitation electrical signal to the test structure through the second pad and the first pad, and electrical parameters of the first trenches and/or the second trenches are obtained according to the first excitation electrical signal and the first test electrical signal; or a second test electrical signal is obtained by applying a second excitation electrical signal to the test structure through the third pad and the first pad, and electrical parameters of the first trenches and/or the second trenches are obtained according to the second excitation electrical signal and the second test electrical signal.

Details of one or more embodiments of the present disclosure are set forth in the following accompany drawings and description. Other features, objects and advantages of the present disclosure will become apparent from the accompany drawings, the specification and the claims.

BRIEF DESCRIPTION OF THE DRAWINGS

To more clearly illustrate technical solution in the embodiments of the disclosure, the drawings used in the embodiments will be briefly described below, and it will be apparent that the drawings described below are only of some embodiments of the disclosure, from which other drawings may be obtained without creative effort by a person of ordinary skill in the art.

FIG. 1 is a flowchart of a preparation method of a semiconductor structure provided by an embodiment of the disclosure.

FIGS. 2A-4C are perspective views and cross-sectional schematic diagrams of structures obtained in operations S20-S40 of a method for preparing a semiconductor structure provided in an embodiment of the disclosure.

FIG. 4C shows cross-sectional schematic diagrams in the aa' direction, bb' direction, cc' direction and dd' direction of the structure shown in the perspective view of FIG. 4A.

FIGS. 5A-8B are perspective views and cross-sectional schematic diagrams of structures obtained in operation S60 of a method for preparing a semiconductor structure provided in an embodiment of the disclosure.

FIG. 8B shows cross-sectional schematic diagrams in the aa' direction, bb' direction, cc' direction and dd' direction of the structure shown in the perspective view of FIG. 8A.

FIG. 11 is a flowchart of a method for testing a semiconductor structure provided by an embodiment of the disclosure.

DETAILED DESCRIPTION

Figure 2A:
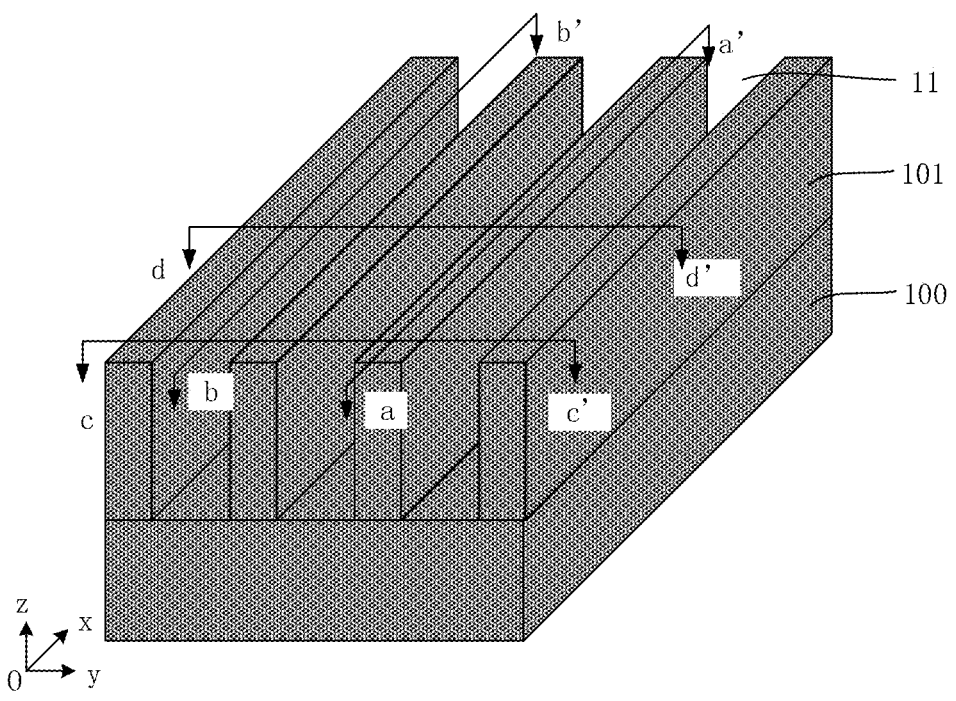

In order to facilitate the understanding of the disclosure, a more complete description will be given below with reference to the relevant drawings. The preferred embodiment of the disclosure is given in the attached drawings. However, the disclosure may be implemented in many different forms and is not limited to the embodiments described herein. Rather, these embodiments are provided to make the disclosure more thorough and comprehensive.

Unless otherwise defined, all technical and scientific terms used herein have the same meanings as are commonly understood by those skilled in the art of the disclosure. Terms used herein in the specification of the disclosure are for the purpose of describing specific embodiments only, and are not intended to limit the disclosure.

It should be understood that when an element or layer is referred to as "above", "adjacent to", "connected to" or "coupled to" another element or layer, it may be directly above, adjacent to, connected to, or coupled to the other element or layer, or may exist intervening elements or layers. Conversely, when an element is called "directly above", "directly adjacent to", "directly connected to" or "directly coupled to" another element or layer, there is no intervening element or layer. It should be understood that, although the terms first, second, third etc. may be used to describe various elements, components, regions, layers, doping types and/or portions, the elements, components, regions, layers, doping types and/or portions should not be limited by such terms. These terms are used only to distinguish one element, component, region, layer, doping type or portion from another element, component, region, layer, doping type or portion. Accordingly, a first element, component, region, layer, doping type, or portion discussed below may be represented as a second element, component, region, layer, or portion without departing from the teachings of the present disclosure. For example, a first doping type may be referred to as a second doping type, and similarly the second doping type may be made the first doping type. The first doping type and the second doping type are different doping types. For example, the first doping type may be P-type and the second doping type may be N-type, or the first doping type may be N-type and the second doping type may be P-type.

Spatial relation terms such as "under", "below", "down", "beneath", "on", "above", etc. may be used herein to describe the relationship of one element or feature shown in the figure to other elements or features. It should be understood that, the spatial relationship terms also include different orientations of devices in use and operation, in addition to the orientations shown in the figures. For example, if a device in the figures is flipped, the element or feature described as "under" or "under" or "under" the other element or feature will be oriented "over" the other element or feature. Therefore, the exemplary terms "under" and "below" may include both upper and lower orientations. Moreover, the device may be additionally oriented (rotated 90 degrees or otherwise) and the spatial descriptions used herein are interpreted accordingly.

As used herein, the singular forms of "a", "an" and "said/the" also include the plural forms, unless the context clearly indicates otherwise. It should also be understood that when the terms "compose" and/or "comprise/include" are used in this specification, the terms determine the presence of said features, integers, steps, operations, elements and/or components, but do not exclude the presence or addition of one or more other features, integers, steps, operations, elements, components and/or groups. As used herein, the term "and/or" includes any and all combinations of related listed items.

The embodiments of the disclosure are described herein with reference to cross-sectional views of schematic diagrams of ideal embodiments (and intermediate structures) in the present disclosure, so that variations in the shapes shown due to, for example, manufacturing techniques and/or tolerances can be anticipated. Accordingly, the embodiments of the present disclosure should not be limited to the specific shapes of the regions shown herein, but include shape deviations due to, for example, manufacturing techniques. For example, an implanted region shown as a rectangle typically has rounded or curved features and/or a gradient of implant concentration at its edges rather than a binary change from an implanted region to a non-implanted region. Likewise, a buried region formed by implantation may result in implantation to some extent in a region between the buried region and the surface through which the implantation proceeds. Accordingly, the regions shown in the figures are schematic diagrams and their shapes do not represent the actual shapes of the regions of the device, and do not limit the scope of the present disclosure.

Referring to FIGS. 1-11, it is to be noted that, the figures provided in the embodiments only illustrate basic ideas of the disclosure in a schematic way. Only elements related to the disclosure are shown in the figures, and the elements are not drawn according to the number, shape and size of an actual implementation. The type, number and proportion of each element in actual implementation may be arbitrarily changed, and layout patterns of the elements may be more complex.

Referring to FIG. 1, in an embodiment of the disclosure, a method for preparing a semiconductor structure is provided, include the following operations.

In S20, a substrate is provided. The substrate includes multiple pillars spaced along a first direction by first trenches and second trenches formed at opposite sides along a second direction of each of the pillars, and the first direction intersects the second direction.

In S40, target conductive structures extending along the second direction are formed in the substrate directly below adjacent second trenches.

In S60, a first dielectric layer, a conductive layer and a second dielectric layer sequentially stacked are formed at least in the first trenches and in the second trenches.

As an example, referring further to FIG. 1, by arranging first trenches and second trenches crosswise, shapes and positions of word line trenches are defined, so that a word line structure can be connected as a whole. A first dielectric layer is formed at bottoms of the first trenches and the second trenches, to isolate the word line structure from bit line structures, so as to avoid leakage between the word line structure and the bit line structures. A conductive layer is formed on the first dielectric layer to generate the word line structure connected as a whole, so as to make the word line structure more stable. A measurement task of the whole word line structure can be completed by selecting only one measurement point arbitrarily when measuring electrical properties, which greatly facilitates the measurement of the electrical properties of the semiconductor structure. Finally, a second dielectric layer is covered above the conductive layer to isolate the word line structure from external environment. Meanwhile, the second dielectric layer protects the word line structure together with the first dielectric layer, to maintain the stability of the word line structure and provide convenience for measuring the electrical properties of the semiconductor structure.

Further, the first direction may be a direction of the word lines and the second direction may be a direction of the bit lines. The first direction intersects the second direction. The first direction and the second direction have an included angle greater than 0° and less than or equal to 90°. For example, the included angle is 1°, 2°, 10°, 30°, 50°, 70°, 90°, or the like.

Optionally, the first direction and the second direction are perpendicular to each other.

Figure 2B:
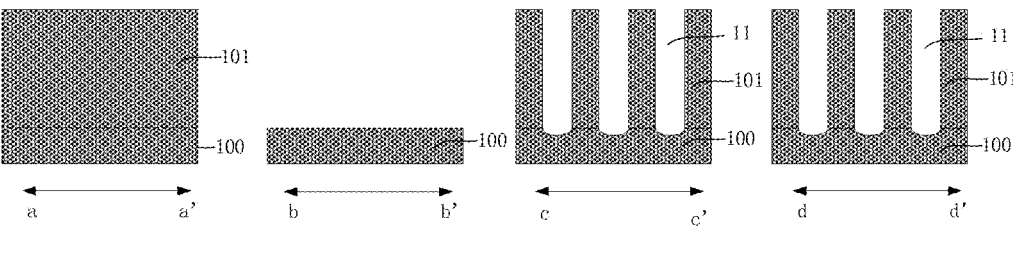
FIG. 2B shows cross-sectional schematic diagrams in the aa' direction, bb' direction, cc' direction and dd' direction of the structure shown in the perspective view of FIG. 2A.
Figure 3A:
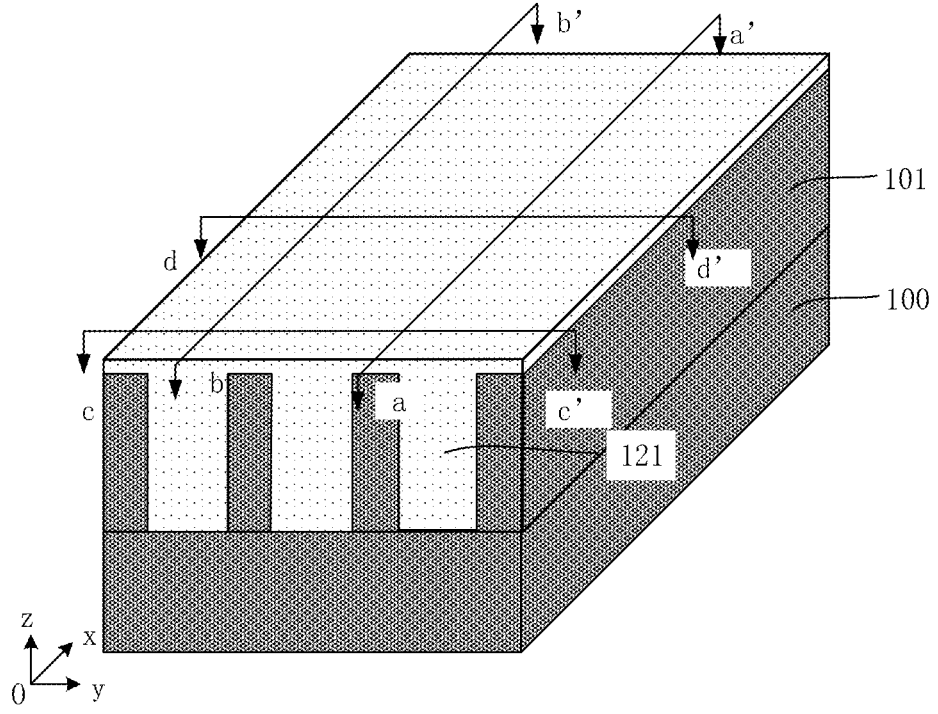
Figure 3B:
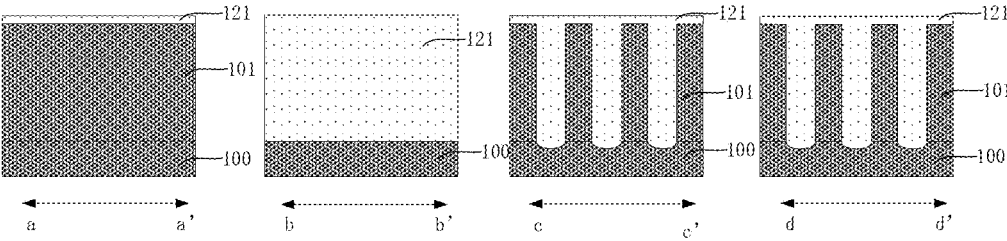
FIG. 3B shows cross-sectional schematic diagrams in the aa' direction, bb' direction, cc' direction and dd' direction of the structure shown in the perspective view of FIG. 3A.

Referring to FIGS. 2A-2B, in S20, providing a substrate, in which the substrate includes multiple pillars spaced along a first direction by first trenches, and second trenches formed at opposite sides along a second direction of each of the pillars, includes the following operations.

In S21, an initial substrate 100 is provided.

In S22, part of the initial substrate 100 is removed to form first trenches 11 and vertical walls 101 extending in the second direction ox and alternately arranged in the first direction.

For example, further referring to FIGS. 2A-2B, in S21, the initial substrate 100 is provided. The first trenches 11 and the vertical walls 101 extending in the second direction, for example the ox direction, and alternately arranged in the first direction oy are formed in the initial substrate 100. The initial substrate 100 and the vertical walls 101 may be composed of a semiconductor material, an insulating material, a conductor material or any combination thereof. The initial substrate 100 may be a single-layer structure or a multi-layer structure. For example, the materials of the initial substrate 100 and vertical walls 101 may be such as silicon (Si), silicon germanium (SiGe), silicon germanium carbon (SiGeC), silicon carbide (SiC), gallium arsenide (GaAs), indium arsenide (InAs), indium phosphide (InP), or other MN semiconductor materials or II/VI semiconductor materials. Alternatively, for example, the initial substrate 100 and vertical walls 101 may also be a layered substrate including, such as Si/SiGe, Si/SiC, silicon on insulator (SOI) or silicon on insulator germanium. Therefore, the material types of the initial substrate 100 and the vertical walls 101 should not limit the scope of protection of the present disclosure.

Further, part of the initial substrate 100 may be etched by a dry etching process in S22 to form the first trenches 11 and the vertical walls 101. A depth and a width of the first trenches 11 are adjusted according to technical requirements, which are not specifically limited in this embodiment. The dry etching at least includes any one of reactive ion etching (RIE), inductively coupled plasma etching (ICP) or high concentration plasma etching (HDP).

As an example, referring to FIGS. 3A-4B, in S20, providing a substrate, in which the substrate includes multiple pillars spaced along a first direction by first trenches and second trenches formed at opposite sides along a second direction of each of the pillars, further includes the following operations.

In S23, a first protective material layer 121 is formed. The first protective material layer at least fills up each of the first trenches.

In S24, part of the vertical walls 101 and part of the first protective material layer 121 are removed to form the multiple pillars 102 spaced by the second trenches 13 along the second direction. The first protective material layer 121 covering the top of each of the pillars 102 constitutes a top protective layer, and a depth of the first trenches 11 is greater than a depth of the second trenches 13.

As an example, further referring to FIGS. 3A-4B, in S23, one or more of a chemical vapor deposition process (CVD), an atomic layer deposition process (ALD), a high density plasma deposition (HDP) process, and a plasma enhanced deposition process may be used. A first protective material layer 121 is formed in the first trenches 11 and on upper surfaces of the vertical walls 101. A material of the first protective material layer 121 include, but are not limited to, a silicon oxide ($SiO_2$) layer, a silicon nitride ($Si_3N_4$) layer, an alumina ($Al_2O_3$) layer or a silicon oxynitride (SiON) layer. After an upper surface of the first protective material layer 121 is planarized by a planarization process or an etching process, part of the first protective material layer 121 and part of the vertical walls 101 are then etched by using a dry etching process in S24, to form the second trenches 13. By arranging the first trenches 11 and the second trenches 13 crosswise, the vertical walls 101 are divided into multiple pillars 102 spaced by the second trenches 13 along the second direction, such as the ox direction, while retaining the first protective material layer 121 on tops of the pillars 102 to form top protective layers 12. The depth of the second trenches 13 is smaller than the depth of the first trenches 11. When the second trenches 13 are too deep, there may not be sufficient space for subsequent formation of bit lines. When the second trenches 13 are too shallow, a height of the pillars 102 decreases, which results in insufficient space for word lines and vertical gate all around transistors. The planarization process may include, but is not limited to, a chemical mechanical polishing process.

Each of the pillars 102 is used to form a transistor subsequently, which has a low resistance to produce a semiconductor structure with performances meeting requirements. The device formed by the pillar 102 may be a junction-free transistor. The pillar 102 includes a source, a vertical channel and a drain arranged in sequence, and doping ions in the source, the vertical channel and the drain are of the same type. On one hand, the control ability of the gates of the transistors can be ensured, and an integration density and electrical performance of the semiconductor structure can be improved. On the other hand, the influence caused by formation of the bit lines can be greatly avoided, thereby avoiding a final influence on the performance of the semiconductor structure.

As an example, referring to FIG. 4C, in S40, forming target conductive structures extending along the second direction in the substrate directly below adjacent second trenches includes the following operations.

In S41, protective sidewalls 122 are formed at least on sidewalls of each of the pillars 102.

In S42, ions are implanted into the initial substrate 100 below the second trenches 13 through bottoms of the second trenches 13 and an annealing process is performed such that conductive regions formed in the initial substrate 100 directly below adjacent second trenches 13 are electrically connected, so as to form the target conductive structures 14. Bottoms of the first trenches 11 are lower than a bottom of any one of the conductive regions.

Figure 4A:
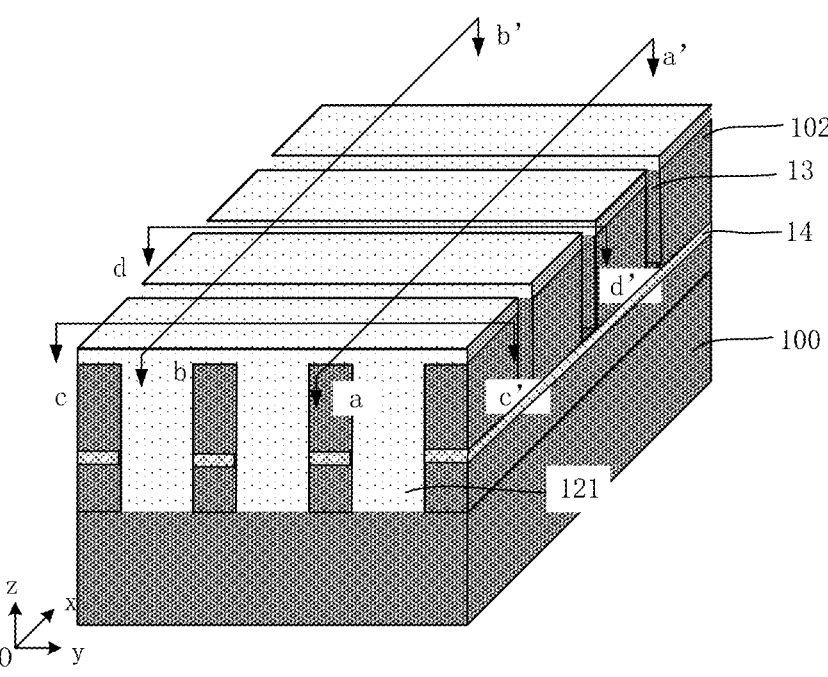
Figure 4B:
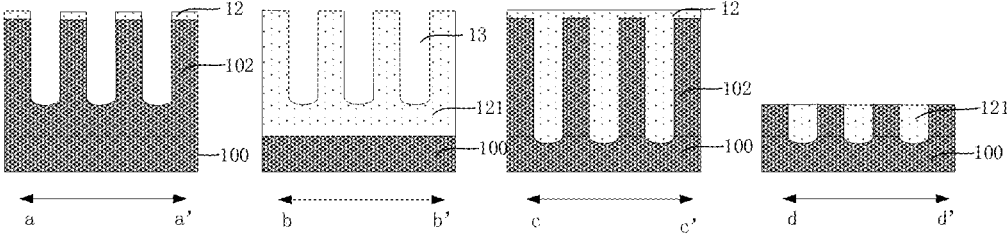
FIG. 4B shows cross-sectional schematic diagrams in the aa' direction, bb' direction, cc' direction and dd' direction of the structure shown in the perspective view of FIG. 4A.
Figure 4C:
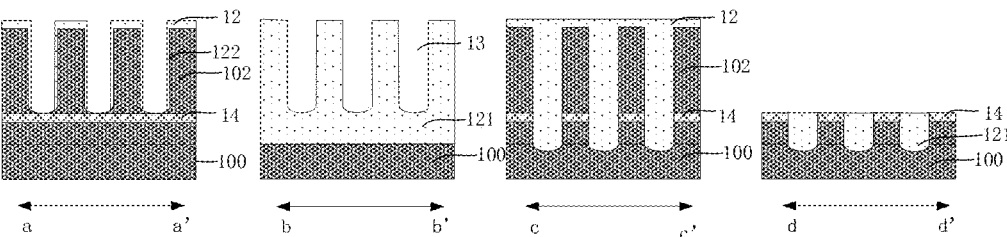
Figure 5A:
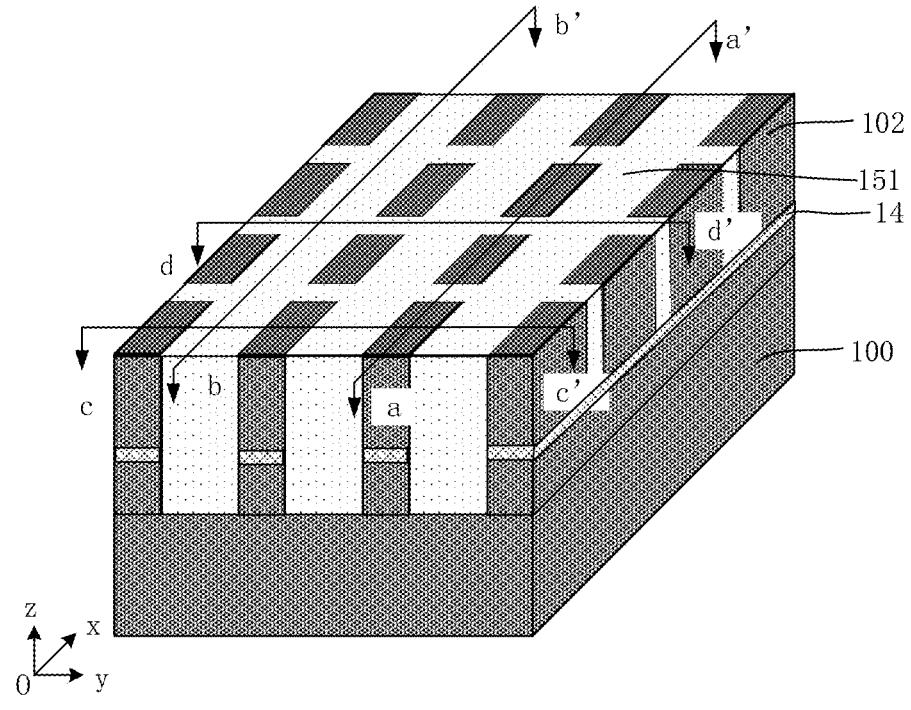
Figure 5B:
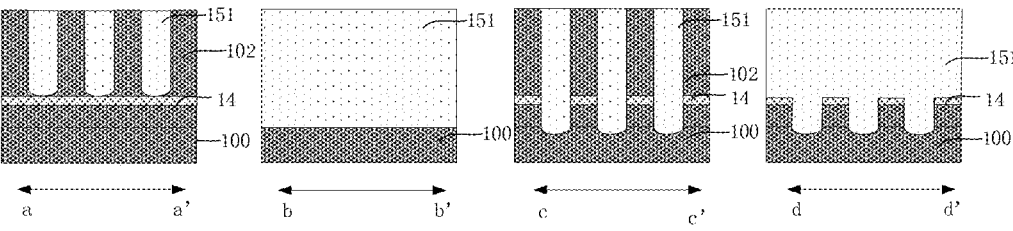
FIG. 5B shows cross-sectional schematic diagrams in the aa' direction, bb' direction, cc' direction and dd' direction of the structure shown in the perspective view of FIG. 5A.
Figure 6A:
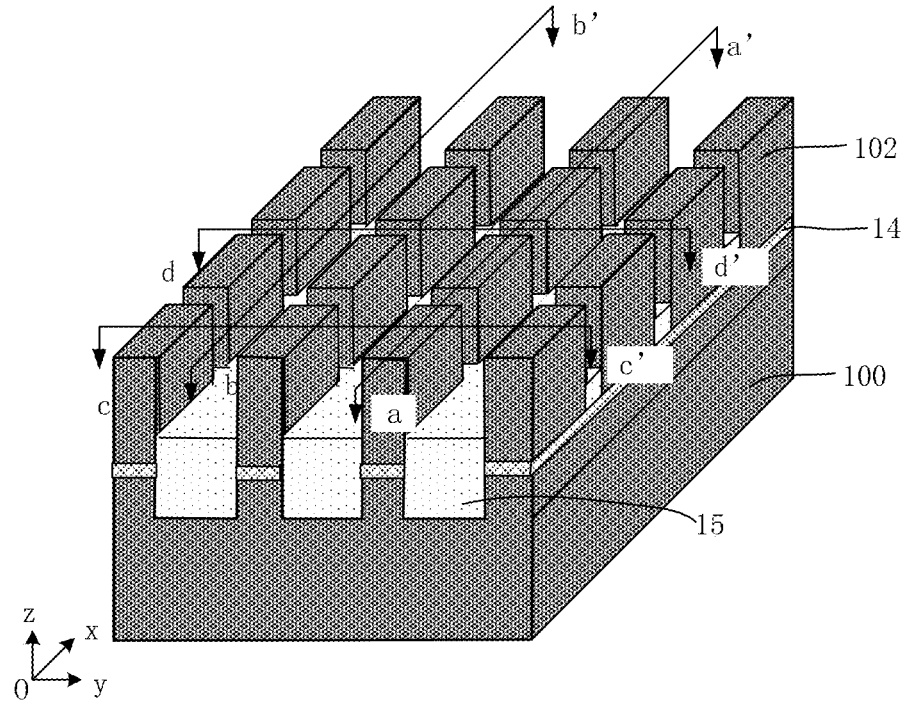
Figure 6B:
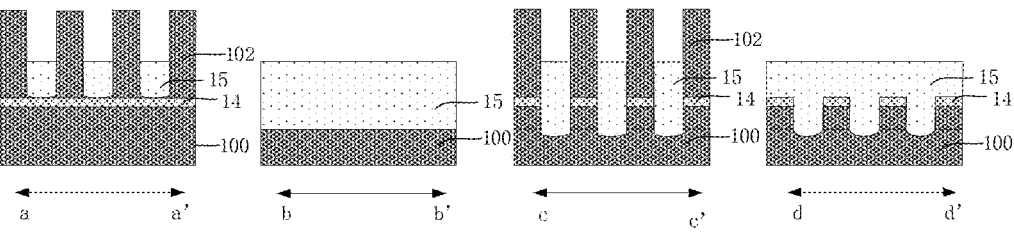
FIG. 6B shows cross-sectional schematic diagrams in the aa' direction, bb' direction, cc' direction and dd' direction of the structure shown in the perspective view of FIG. 6A.
Figure 7A:
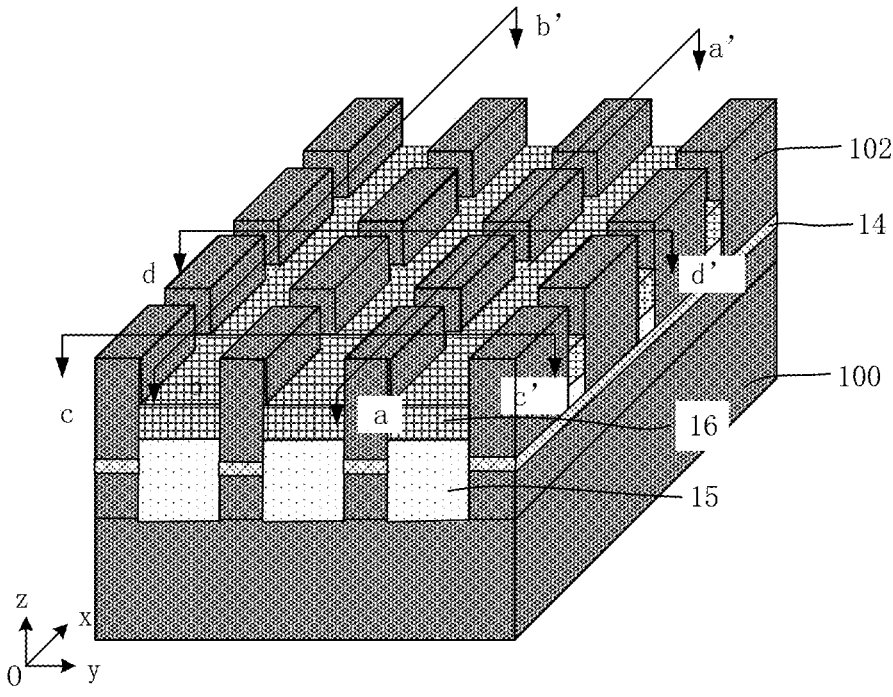
Figure 7B:
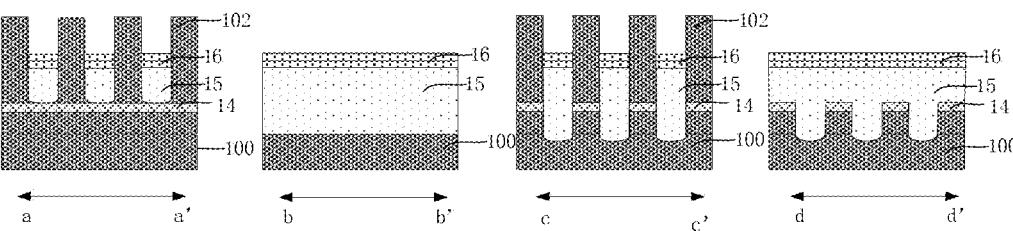
FIG. 7B shows cross-sectional schematic diagrams in the aa' direction, bb' direction, cc' direction and dd' direction of the structure shown in the perspective view of FIG. 7A.
Figure 8A:
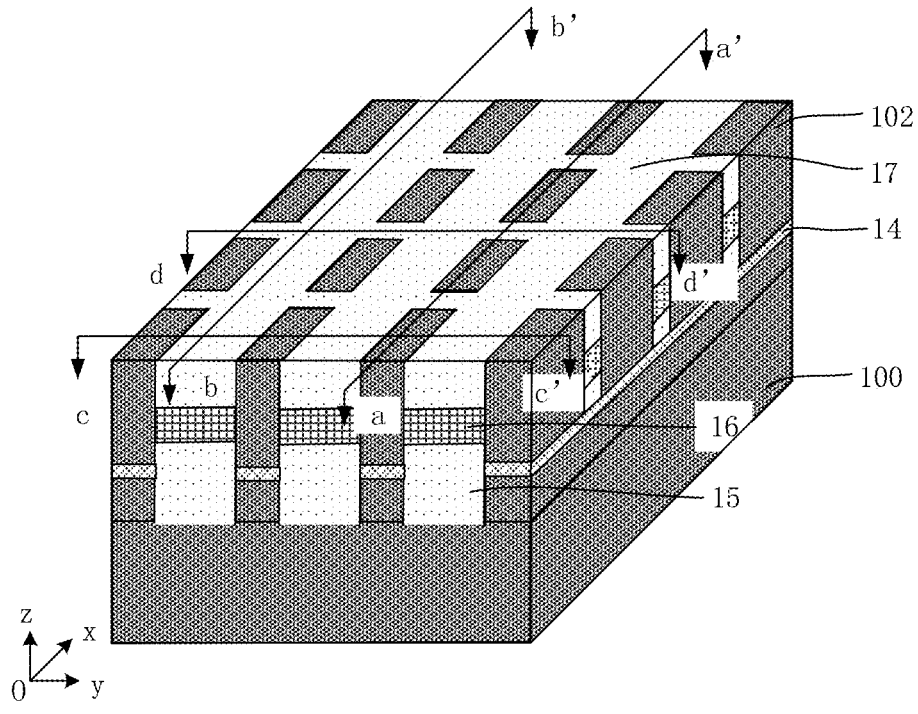
Figure 8B:
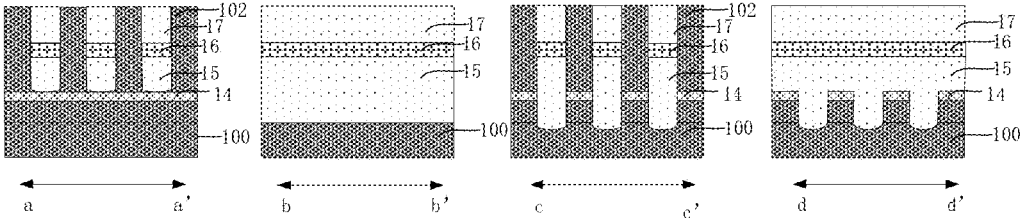

As an example, further referring to FIG. 4C, in S41, the protective sidewalls are formed at least on sidewalls of each of the pillars by a deposition process, to protect the pillars 102 from being damaged or contaminated by doping ion in a subsequent process. In S42, doping ions are then implanted into the initial substrate 100 below the second trenches 13 by an ion implantation process, and an annealing process is performed such that the doping ions diffuse into the initial substrate 100 to form electrically connected target conductive structures 14. During the doping process, the protective walls 122 can effectively protect the sidewalls of the pillars 102 from being doped with the doping ions, so as to ensure an insulation performance of the pillars 102. During the annealing treatment, the protective walls 122 can also effectively protect the pillars 102 from deformation and improve structural stability of the pillars 102. In some embodiments, the target conductive structures 14 may form the bit line structures. A material of the protective walls 122 is the same as the material of the first protective material layer 121, and a material of the target conductive structures 14 includes at least one of titanium, arsenic, cobalt or nickel. The annealing process may be a wet annealing process or a dry annealing process. Parameters of the annealing process may include the follows. A temperature is 800° C.-1500° C. For example, the annealing temperature may be 800° C., 900° C., 1000° C., 1100° C., 1200° C., 1300° C., 1400° C. or 1500° C. An annealing gas includes one of or a combination of more of $H_2$, $O_2$, $N_2$, Ar and He. An annealing time is 1.5-2.5 hours. For example, the annealing time may be 1.5 hours, 2.0 hours or 2.5 hours. When the annealing gas includes $H_2$ and $O_2$, the annealing process is a wet annealing process.

As an example, further referring to FIG. 4C, in S20, providing a substrate, in which the substrate includes multiple pillars spaced along a first direction by first trenches and second trenches formed at opposite sides along a second direction of each of the pillars, further includes the following operations.

In S51, a first isolation layer and a second conductive layer sequentially stacked in each of the first trenches 11 are formed. The first isolation layer has a preset thickness.

In S52, ions are implanted into the substrate below each of the vertical wall adjacent to the second conductive layer through the second conductive layer and an annealing process is performed to form the target conductive structure 14 in the initial substrate 100 directly below the vertical wall 101 adjacent to the second conductive layer.

In S53, the first isolation layers and the second conductive layers are removed.

As an example, in S51-S53, by forming the first isolation layers (not shown) and the second conductive layers (not shown) in the first trenches 11, doping ions are implanted under the vertical walls 101 adjacent to the second conductive layers, and an annealing process is performed, in order to diffuse the doped ions into the vertical walls 101 to ensure that the target conductive structures 14 formed in S42 are effectively electrically connected as a whole in the vertical walls 101, so as to form the bit line structures, which enhances conductivity of the bit line structures. Then the first isolation layers and the second conductive layers are removed (not shown). For example, P-type ions, such as B ions, may be used by the ion implantation process. In other embodiment, for example, N-type ions may be used, which allows a higher current. In particular, for example, As, P ions may be used. A preset energy of these ion implantations is, for example, 1 Kev-20 Kev; and/or a preset dose is 1e15 $cm^{-2}$-1e18 $cm^{-2}$. For example, the preset energy is 1 KeV, 1.5 KeV, 5 KeV, 10 KeV and 12 KeV. The preset dose is 1e15 $cm^{-2}$, 5e15 $cm^{-2}$, 1e16 $cm^{-2}$, 1e17 $cm^{-2}$ and 1e18 $cm^{-2}$. An ion implantation, such as an ion implantation at a low energy and with a high dose, is performed at least once. During the process of forming the target conductive structures 14, impurities may accumulate at an interface between silicide and silicon due to segregation, thereby reducing a Schottky contact resistance and improving the performance of the semiconductor structure. By forming continuous metal silicide as buried bit lines in the substrate, the resistance of the semiconductor structure is reduced and the performance of the semiconductor structure is improved. The semiconductor structure may be used in vertical gate all around transistors (VGAA transistors for short), thereby effectively reducing the size of a memory and improving the integration and performance of the memory.

As an example, referring to FIGS. 5A-8B, in S60, forming a first dielectric layer, a conductive layer and a second dielectric layer sequentially stacked at least in each of the first trenches and in each of the second trenches includes the following operations.

In S61, a first dielectric material layer 151 is formed. The first dielectric material layer 151 at least fills up each of the first trenches 11 and each of the second trenches 13.

In S62, the first dielectric material layer 151 is etched to form the first dielectric layer 15 in the first trenches 11 and the second trenches 13.

In S63, a first conductive material layer is formed. The first conductive material layer at least fills up each of the first trenches 11 and each of the second trenches 13.

In S64, the first conductive material layer is etched back to form the conductive layer 16 in the first trenches 11 and the second trenches 13.

In S65, the second dielectric material layer is formed. The second dielectric material layer at least fills up each of the first trenches 11 and each of the second trenches 13.

As an example, referring further to FIGS. 5A-8B, in S61-S62, the first dielectric material layer 151 is deposited on the first trenches 11 and the second trenches 13. Then the first dielectric material layer 151 is etched by a wet etching process with an etching depth not exceeding the depth of the second trenches 13, so as to ensure that the bit line structures in lower part of the substrate 10 are not exposed and electrical isolation spaces between the bit line structure and the word line structures are improved. A surface uniformity of the first dielectric layers 15 formed by the wet etching process is good, which ensures that the word line structures deposited thereon are flatter and more uniform, and the electrical properties of the semiconductor structure are better. The first dielectric material layer 151 includes, but is not limited to, a silicon oxide layer ($SiO_2$), a silicon nitride layer ($Si_3N_4$), an aluminum oxide ($Al_2O_3$) or a silicon oxynitride layer (SiON). In S63 to S64, the first conductive material layer (not shown) is deposited on the first dielectric layer 15 and filled up the first trenches 11 and the second trenches 13. Then the first conductive material layer is etched downward a certain depth by a dry etching process, and thus the conductive layer 16 having a preset thickness are formed. In some embodiments, the conductive layer 16 is the word line structure. The conductive layer 16 is a whole conductor structure interlaced in the first direction and the second direction, with a position limited by the pillars 102, to ensure a stability of the word line structure. The dry etching includes at least one of reactive ion etching (RIE), inductively coupled plasma etching (ICP) or high concentration plasma etching (HDP). In some embodiments, a material of the conductive layer 16 may include metal materials, such as Co, Ni, Ti, W, Cu, Al or the like. In S65, the second dielectric material layer (not shown) is deposited on the conductive layer 16 and filled up the first trenches 11 and the second trenches 13. The second dielectric layer 17 is formed by a planarization process or an etching process, to make upper surface of the resulting structure flush. The remaining initial substrate 100 constitutes the substrate. By the second dielectric layer 17 and the first dielectric layer 15, the word line structure formed by the conductive layer 16 is sandwiched and fixed therebetween. Therefore, on one hand, insulation of the word line structure from the bit line structures and external environment is improved; on the other hand, the stability of the word line structure is enhanced, so that the word line structure is not easy to be damaged, thereby providing a strong support for a subsequent electrical test. In some embodiments, a material of the second dielectric layer 17 is the same as that of the first dielectric layer 15, including, but not limited to, a silicon oxide layer (SiO$_2$), a silicon nitride layer (Si$_3$N$_4$), an alumina (Al$_2$O$_3$) layer or a silicon oxynitride layer (SiON).

As an example, further referring to FIGS. 2A-8B, in some embodiments of the disclosure, a semiconductor structure is provided. The semiconductor structure includes a substrate 100. The substrate includes multiple pillars 102 spaced along a first direction by first trenches 11, such as the oy direction. Second trenches 13 are formed at opposite sides along a second direction of each of the pillars 102, such as the ox direction. Target conductive structures 14 extending along the second direction, such as the ox direction, are formed in the substrate 100 directly below the adjacent second trenches 13. A first dielectric layer 15, a conductive layer 16 and a second dielectric layer 17 are sequentially stacked in each of the first trenches 11 and in each of the second trenches 13. A depth of the first trenches 11 is greater than a depth of the second trenches 13. The first direction intersects the second direction.

In the semiconductor structure of the above embodiment, the conductive layer 16 is provided to form a word line structure. The word line structure is connected into a whole. The word line structure is isolated from the bit line structures of the conductive regions by the first dielectric layer 15 to avoid leakage between the word line structure and the bit line structures. Meanwhile, the word line structure is protected in a middle position by the stacked coverage of the second dielectric layer 17 and the first dielectric layer 15, so that the word line structure is more stable and not easy to be damaged. A measurement task of all the word line structure can be completed by arbitrarily selecting only one measurement point when measuring electrical properties, which greatly facilitates the measurement of the electrical properties of the semiconductor structure.

As an example, further referring to FIGS. 2A-8B, the conductive layer 16 in each of the second trenches 13 is electrically connected to the conductive layer 16 in each of the first trenches 11. Position of the conductive layer 16 is defined by the first trenches 11 and the second trenches 13 which are arranged crosswise, so that parts of the formed conductive layer 16 in the first trenches 11 and the second trenches 13 are connected interlaced, which improves the stability of the word line structure and greatly facilitates an electrical property test of the semiconductor structure.

As an example, further referring to FIGS. 2A-8B, the upper surface of the first dielectric layer 15 in the second trenches 13 is flush with the upper surface of the first dielectric layer 15 in the first trenches 11. The upper surface of the first dielectric layer 15 in the first trenches 11 and the second trenches 13 is flush, so that dimension difference of the word line structure obtained by subsequent etching can be avoided, and distortion or fracture in the process for forming the word line structure can be avoided, thereby improving strength and uniformity of the word line structure.

As an example, further referring to FIGS. 2A-8B, the upper surface of the conductive layer 16 in the second trenches 13 is flush with the upper surface of the conductive layer 16 in the first trenches 11. Upper and lower surfaces of the word line structure formed by the conductive layer 16 are all flush, ensuring the same thickness everywhere, which can maximize structural strength of the word line structure, prevent the word line structure from being distorted, deformed or even broken due to uneven dimension, ensure a uniformity of electrical properties of the word line structure, and facilitates the subsequent electrical property test.

As an example, further referring to FIGS. 2A-8B, the upper surface of the second dielectric layer 17 in the second trenches 13 is flush with upper surface of the second dielectric layer 17 in the first trenches 11. Keeping the upper surface of the semiconductor structure flush can improve structural stability of the pillars 102, prevent distortion of the pillars 102, and further affect stability of the word line structure or the bit line structures inside the semiconductor structure.

As an example, further referring to FIGS. 2A-8B, the bottoms of the first trenches 11 are lower than a bottom of any one of the conductive regions, so that the adjacent bit line structures are electrically isolated from each other by the first dielectric layer 15, thereby preventing leakage current between the bit lines.

For example, a material for preparing the conductive regions includes at least one of titanium, arsenic, cobalt or nickel.

Figure 9:
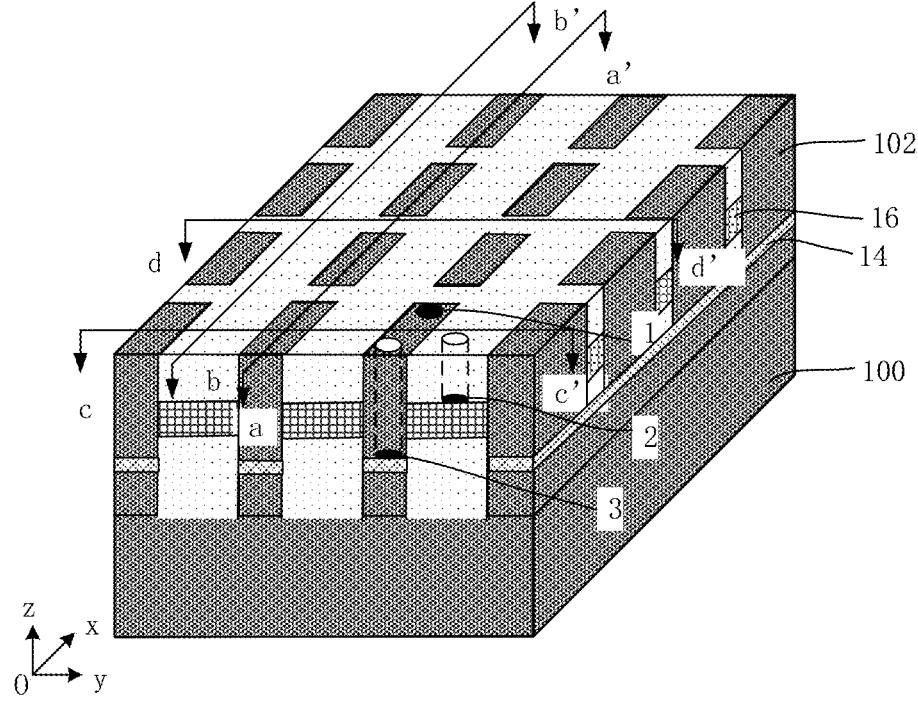
FIG. 9 is a perspective-view schematic diagram of a semiconductor test structure provided in an embodiment of the disclosure.

As an example, referring to FIG. 9, in some embodiments of the disclosure, a test structure is provided, including a semiconductor structure in any of the foregoing embodiments, a first pad 1, a second pad 2, and/or a third pad 3. The first pad 1 is electrically connected with a pillar 102. The second pad 2 is electrically connected with the conductive layer 16. The third pad 3 is electrically connected with a conductive region 14.

In the above test structure in the embodiment, the first pad 1 is prepared on the pillar 102 to lead out a voltage reference point of the electrical measurement, the second pad 2 is prepared on the conductive layer 16 to lead out a measurement point of the word line structure, the third pad 3 is prepared on the conductive region 14 to lead out a measurement point of a bit line structure, and a test of measurement of electrical properties is carried out through the first pad 1, the second pad 2 and the third pad 3 mentioned above. On the one hand, the structure of the semiconductor structure is protected from mechanical damage, on the other hand, stability and repeatability of the measurement are ensured, so as to make measurement results more accurate.

As an example, in some embodiments of the disclosure, a preparation method of a test structure is provided, including the following operations.

In S1, a semiconductor structure in any of the foregoing embodiments is provided.

In S2, a first pad 1 electrically connected to one of the pillars 102 is formed.

In S3, a second pad 2 and/or a third pad 3 is formed. The second pad 2 is electrically connected to the conductive layer 16, and the third pad 3 is electrically connected to one of the conductive regions.

As an example, further referring to FIG. 9, the preparation method of the test structure, further includes the following operations.

A target conductor is exposed by a focused ion beam irradiation process or a wet etching process. The target conductor includes at least one of a pillar 102, the conductive layer 16 or a target conductive structure 14.

A measurement pad is formed on the exposed target conductor, and the measurement pad includes the first pad 1, the second pad 2, and/or the third pad 3.

Figure 10A:
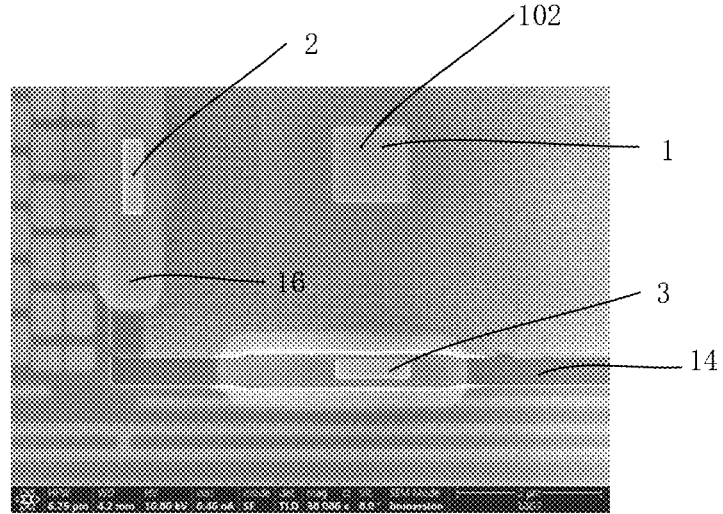
FIGS. 10A-10B are photographs of a semiconductor test structure provided in an embodiment of the disclosure.
Figure 10B:
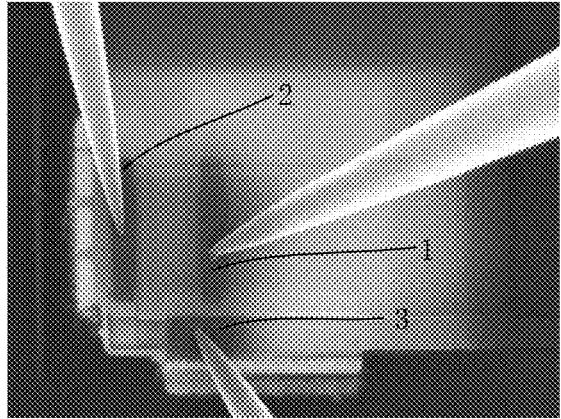

For example, referring to FIGS. 10A-10B, on top of a semiconductor structure, three measuring points are selected aligned with a pillar 102, the conductive layer 16 and a target conductive structure 14, respectively. A focused ion beam irradiation or wet etching process is adopted to etch down until the word line structure, the bit line structure and the pillar with impurities removed are respectively exposed. A second pad electrically connected with the word line structure, a third pad electrically connected with the bit line structure and a first pad electrically connected with the pillar is respectively formed thereon. In an electrical property test, test signals are applied to the above three pads by probes, and thus the measurement can be conveniently performed. On the one hand, further damage to the semiconductor structure can be avoided, and on the other hand, it can ensure repeatability of the test process and accuracy of test results.

As an example, referring to FIG. 11, a test method is provided, including the following operations.

In S100, a test structure prepared by the preparation method of the test structure in the foregoing embodiments is adopted.

In S200, a first test electrical signal is obtained by applying a first excitation electrical signal to the test structure through the second pad and the first pad, and electrical parameters of the first trenches and/or the second trenches are obtained according to the first excitation electrical signal and the first test electrical signal; or a second test electrical signal is obtained by applying a second excitation electrical signal to the test structure through the third pad and the first pad, and electrical parameters of the first trenches and/or the second trenches are obtained according to the second excitation electrical signal and the second test electrical signal.

As an example, by applying the first excitation electrical signal as a test voltage between the second pad 2 and the first pad 1, a corresponding current value is obtained, and a resistance value between the bit line structure and the pillar can be calculated by a ratio of the test voltage and the current value. Similarly, by applying the second excitation electrical signal as a test voltage between the third pad 3 and the first pad, a corresponding current value is obtained, and a resistance value between the word line structure and the pillar can be calculated by a ratio of the test voltage and the current value.

The above-mentioned technical features of the embodiments can be arbitrarily combined. For the sake of concise description, all possible combinations of the above-mentioned technical features of the embodiments have not been described. However, as long as there is no contradiction in the combinations of these technical features, they should be considered to be within the scope described in this specification.

The above-mentioned embodiments only represent several embodiments of the present disclosure, and the description thereof is relatively specific and detailed, but is not to be construed as limiting the scope of the patent application. It should be noted that for those skilled in the art, without departing from the concept of the present disclosure, a number of modifications and improvements may be made, which all fall within the scope of protection of the present disclosure. Therefore, the scope of protection of the patent disclosure shall be subject to the attached claims.

The invention claimed is:

1. A test structure, comprising
   a substrate, wherein the substrate comprises a plurality of pillars spaced along a first direction by first trenches; second trenches formed at opposite sides along a second direction of each of the pillars; target conductive structures extending along the second direction formed in the substrate directly below adjacent second trenches; and a first dielectric layer, a conductive layer and a second dielectric layer sequentially stacked in the first trenches and the second trenches, wherein a depth of the first trenches is greater than a depth of the second trenches; and
   the first direction intersects the second direction;
   a first pad, and at least one of a second pad or a third pad, wherein
   the first pad is electrically connected with one of the pillars;
   the second pad is electrically connected with the conductive layer; and
   the third pad is electrically connected with one of the target conductive structures.

2. A method for manufacturing a test structure, comprising:
   a substrate, wherein the substrate comprises a plurality of pillars spaced along a first direction by first trenches; second trenches formed at opposite sides along a second direction of each of the pillars; target conductive structures extending along the second direction formed in the substrate directly below adjacent second trenches; and a first dielectric layer, a conductive layer and a second dielectric layer sequentially stacked in the first trenches and the second trenches, wherein a depth of the first trenches is greater than a depth of the second trenches; and
   the first direction intersects the second direction;
   forming a first pad electrically connected with one of the pillars; and
   forming at least one of a second pad or a third pad, wherein the second pad is electrically connected with the conductive layer, and the third pad is electrically connected with one of the target conductive structures.

3. The method for manufacturing a test structure of claim 2, further comprising:
   exposing a target conductor by a focused ion beam irradiation process or a wet etching process, wherein the target conductor comprises at least one of the pillar, the conductive layer or the target conductive structure; and
   forming a measurement pad on the exposed target conductor, and the measurement pad comprises the first pad, and at least one of the second pad or the third pad.

4. A test method, comprising:

adopting a test structure manufactured by the method for manufacturing a test structure of claim 2;

obtaining a first test electrical signal by applying a first excitation electrical signal to the test structure through the second pad and the first pad, and obtaining electrical parameters of at least one of the first trenches or the second trenches according to the first excitation electrical signal and the first test electrical signal;

or obtaining a second test electrical signal by applying a second excitation electrical signal to the test structure through the third pad and the first pad, and obtaining the electrical parameters of at least one of the first trenches or the second trenches according to the second excitation electrical signal and the second test electrical signal.

5. The test structure of claim 1, wherein the conductive layer in each of the second trenches is electrically connected to the conductive layer in each of the first trenches.

6. The test structure of claim 1, wherein an upper surface of the conductive layer in the second trenches is flush with an upper surface of the conductive layer in the first trenches.

7. The test structure of claim 1, wherein an upper surface of the first dielectric layer in the second trenches is flush with an upper surface of the first dielectric layer in the first trenches.

8. The test structure of claim 1, wherein an upper surface of the second dielectric layer in the second trenches is flush with an upper surface of the second dielectric layer within the first trenches.

9. The test structure according to claim 1, wherein bottoms of the first trenches are lower than a bottom of any of the target conductive structures.

10. The test structure according to claim 1, wherein a preparation material of the target conductive structures comprises at least one of titanium, arsenic, cobalt or nickel.

* * * * *